(12) United States Patent
Parikh et al.

(10) Patent No.: US 8,344,398 B2
(45) Date of Patent: Jan. 1, 2013

(54) LOW VOLTAGE DIODE WITH REDUCED PARASITIC RESISTANCE AND METHOD FOR FABRICATING

(75) Inventors: Primit Parikh, Goleta, CA (US); Sten Heikman, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/905,374

(22) Filed: Oct. 15, 2010

(65) Prior Publication Data
US 2011/0031579 A1    Feb. 10, 2011

Related U.S. Application Data

(62) Division of application No. 11/655,696, filed on Jan. 19, 2007, now Pat. No. 7,834,367.

(51) Int. Cl.
*H01L 33/00* (2010.01)

(52) U.S. Cl. .......... 257/94; 257/449; 257/450; 257/451; 257/452; 257/453; 257/454; 257/455; 257/456; 257/457

(58) Field of Classification Search .......... 257/449–486, 257/E29.04, E29.148, E29.338
See application file for complete search history.

(56) References Cited

U.S. PATENT DOCUMENTS

| | | |
|---|---|---|
| 3,896,479 A | 7/1975 | Di Lorenzo |
| 4,152,044 A | 5/1979 | Liu |
| 4,675,575 A | 6/1987 | Smith et al. |
| 4,946,547 A | 8/1990 | Palmour et al. ............. 156/643 |
| 5,200,022 A | 4/1993 | Kong et al. .................. 156/612 |
| RE34,861 E | 2/1995 | Davis et al. ................. 437/100 |
| 5,477,436 A | 12/1995 | Bertling et al. |
| 5,612,567 A | 3/1997 | Baliga |
| 6,046,464 A | 4/2000 | Schetzina |
| 6,330,111 B1 | 12/2001 | Myers |
| 6,331,915 B1 | 12/2001 | Myers |
| 6,657,393 B2 | 12/2003 | Natsume |
| 6,746,889 B1 | 6/2004 | Eliashevich et al. |
| 6,784,463 B2 | 8/2004 | Camras et al. |
| 6,932,497 B1 | 8/2005 | Huang |
| 7,087,936 B2 | 8/2006 | Negley |
| 2002/0015013 A1 | 2/2002 | Ragle |

(Continued)

FOREIGN PATENT DOCUMENTS

EP    1063711 A1    12/1920

(Continued)

OTHER PUBLICATIONS

"The American Heritage Dictionary", Library of Congress, New College Ed., 1976. pp. 867.

(Continued)

*Primary Examiner* — Tran Tran
(74) *Attorney, Agent, or Firm* — Koppel, Patrick, Heybl & Philpott

(57) ABSTRACT

A method of making a diode begins by depositing an $Al_xGa_{1-x}N$ nucleation layer on a SiC substrate, then depositing an n+ GaN buffer layer, an n− GaN layer, an $Al_xGa_{1-x}N$ barrier layer, and an $SiO_2$ dielectric layer. A portion of the dielectric layer is removed and a Schottky metal deposited in the void. The dielectric layer is affixed to the support layer with a metal bonding layer using an Au—Sn utectic wafer bonding process, the substrate is removed using reactive ion etching to expose the n+ layer, selected portions of the n+, n−, and barrier layers are removed to form a mesa diode structure on the dielectric layer over the Schottky metal, and an ohmic contact is deposited on the n+ layer.

17 Claims, 5 Drawing Sheets

U.S. PATENT DOCUMENTS

| | | |
|---|---|---|
| 2002/0054495 A1 | 5/2002 | Natsume |
| 2003/0015708 A1 | 1/2003 | Parikh |
| 2003/0020069 A1 | 1/2003 | Holmes et al. |
| 2003/0085409 A1 | 5/2003 | Shen et al. |
| 2003/0165169 A1 | 9/2003 | Nomoto et al. |
| 2004/0080010 A1 | 4/2004 | Parikh et al. |
| 2004/0207313 A1 | 10/2004 | Omoto et al. |
| 2005/0077535 A1 | 4/2005 | Li |
| 2005/0117320 A1 | 6/2005 | Leu et al. |
| 2005/0152127 A1 | 7/2005 | Kamiya et al. |
| 2005/0173692 A1 | 8/2005 | Park |
| 2005/0173728 A1 | 8/2005 | Saxler |
| 2006/0034576 A1 | 2/2006 | Merritt et al. |
| 2006/0081862 A1 | 4/2006 | Chua et al. |
| 2006/0158899 A1 | 7/2006 | Ayabe et al. |
| 2006/0220046 A1 | 10/2006 | Yu |
| 2006/0267031 A1 | 11/2006 | Tasch et al. |
| 2007/0025231 A1 | 2/2007 | Ochiai et al. |
| 2007/0090383 A1 | 4/2007 | Ota et al. |
| 2008/0036364 A1 | 2/2008 | Li et al. |
| 2008/0074032 A1 | 3/2008 | Wang et al. |
| 2011/0193057 A1 | 8/2011 | Sabathil et al. |

FOREIGN PATENT DOCUMENTS

| | | |
|---|---|---|
| EP | 0 272 985 A2 | 6/1988 |
| EP | 0881666 A2 | 12/1998 |
| EP | 0936682 | 8/1999 |
| EP | 1189289 A1 | 3/2002 |
| EP | 1313187 A1 | 5/2003 |
| EP | 1349202 A | 10/2003 |
| EP | 1653255 | 5/2006 |
| EP | 1681509 | 7/2006 |
| EP | 2048718 | 4/2009 |
| FR | 2586844 | 3/1987 |
| FR | 2759188 | 8/1998 |
| FR | 2814220 | 3/2002 |
| JP | 11330552 | 11/1966 |
| JP | S63-288061 | 11/1988 |
| JP | H05-075101 | 3/1993 |
| JP | H05-283672 | 10/1993 |
| JP | 6268257 A | 9/1994 |
| JP | 7162038 A | 6/1995 |
| JP | 7176826 A | 7/1995 |
| JP | 8023124 A | 1/1996 |
| JP | 8070139 A | 3/1996 |
| JP | 8162671 A | 6/1996 |
| JP | 8274414 A | 10/1996 |
| JP | 9330630 A | 12/1996 |
| JP | 9148678 A | 6/1997 |
| JP | 9153642 A | 6/1997 |
| JP | 9162444 A | 6/1997 |
| JP | 11040850 | 7/1997 |
| JP | 9219556 A | 8/1997 |
| JP | 10012969 A | 1/1998 |
| JP | 10041581 A | 2/1998 |
| JP | 10065271 | 3/1998 |
| JP | 10145000 A | 5/1998 |
| JP | 10145002 A | 5/1998 |
| JP | 10033557 A | 12/1998 |
| JP | 11074562 A | 3/1999 |
| JP | 11186659 A | 7/1999 |
| JP | 11191638 A | 7/1999 |
| JP | 11224972 A | 8/1999 |
| JP | 11238945 A | 8/1999 |
| JP | 11251684 A | 9/1999 |
| JP | 11298090 A | 10/1999 |
| JP | 2000-049363 | 2/2000 |
| JP | 2000068594 A | 3/2000 |
| JP | 2000-150920 | 5/2000 |
| JP | 2000133883 A | 5/2000 |
| JP | 2000150956 A | 5/2000 |
| JP | 2000244072 A | 9/2000 |
| JP | 2000307149 A | 11/2000 |
| JP | 2001168471 | 6/2001 |
| JP | 2003-59938 | 2/2003 |
| JP | 2003-152219 | 5/2003 |
| JP | 2007-036010 | 2/2007 |
| JP | 2007-189239 | 7/2007 |
| JP | 2007189239 | 7/2007 |
| JP | 2009094517 | 4/2009 |
| WO | WO 9831055 A1 | 7/1998 |
| WO | WO 98/37585 A1 | 8/1998 |
| WO | WO 9856043 | 12/1998 |
| WO | WO 9905728 A1 | 2/1999 |
| WO | WO 9946822 A1 | 9/1999 |
| WO | WO 0021143 | 4/2000 |
| WO | WO 0076004 A1 | 12/2000 |
| WO | WO 01-41224 | 6/2001 |
| WO | WO 02-01608 | 1/2002 |
| WO | WO 0205399 A1 | 1/2002 |
| WO | WO 02/11212 A | 2/2002 |
| WO | WO 0211212 A | 2/2002 |
| WO | 03044870 | 5/2003 |
| WO | WO 03080763 | 10/2003 |
| WO | WO 2005/098976 A | 10/2005 |
| WO | WO 2005104247 | 11/2005 |
| WO | WO 2007005844 A | 1/2007 |
| WO | WO 2007075815 | 7/2007 |
| WO | WO 2008/020913 | 2/2008 |
| WO | WO 2008020913 | 2/2008 |

OTHER PUBLICATIONS

"Properties of Delta Doped A10.25Ga0.75N and GaN Epitaxial Layers", Jeffrey S. Flynn, et al, Materials Research Society, 1 page.

"III-nitride ultraviolet light-emitting diodes with delta doping". K.H. Kim, et al. Applied Physics Letters, vol. 83, No. 3, Jul. 21, 2003. pp. 566-568.

Reduction of threading edge dislocation density in n-type GaN by Si delta-doping, Y.B. Pan, et al, Journal of Crystal Growth 286 (2006) 255-258.

Epitaxial Growth and Characterisation of Silicon Delta-Doped GaAs, AlAs and AlxGal-xAs, B. Sciana, et al, Crystal Res. Technol. 36 2001 8-10, pp. 1145-1154.

"Effects of periodic delta-doping on the properties of GaN:Si films grown on Si (111) substrates" L.S. Wang, et al, Applied Physics Letters, vol. 85, No. 34, Dec. 13, 2004, pp. 5881-5884.

"The effect of periodic silane burst on the properties of GaN on Si (111) substrates", Zang Keyan, et al, Singapore—MIT Alliance. E4-04-10 & Dept. of Materials Science and Engineering 4 pages.

European Search Report, EP 03 07 8515, dated: Feb. 2, 2004.

Partial European Search Report, EP 09 15 7557, dated: May 28, 2009.

Non-final Rejection, Korean Appl. No. 10-2003-7012710, dated: Aug. 8, 2008.

Non-final Rejection, Korean Appl. No. 10-2008-7026427, dated: Jan. 23, 2009.

Summary of Notice of Reasons for Rejection for Japanese Patent Application No. 2008-262602 mailed Jul. 12, 2011.

Office Action for Canadian Patent Application No. 2,454,310 dated Aug. 30, 2011.

Summary of Notice of Reasons for Rejection for counterpart Japanese Patent Application No. 2007-292302 dated Oct. 4, 2011.

Notification of National Application Upon the Preliminary Examination of Patent Application from Chinese Patent Application No. 200880100370.5 dated Jun. 1, 2010.

Notification on Publication and Entry into Procedure of Substantive Examination of Invention Patent Application from Chinese Patent Application No. 200880100370.5 dated Aug. 18, 2010.

Office Action from U.S. Appl. No. 11/900,952, Dated: May 26, 2011.

Office Action from U.S. Appl. No. 13/045,246, Dated: Oct. 21, 2011.

Invitation to Submit Applicant's Opinion (Summary) in Japanese Appeal Filing No. 2009-007421, Japanese Patent Application No. 2003-529535 mailed Dec. 7, 2010.

Examiner's Report to the Board (Summary) in Japanese Appeal Filing No. 2009-007421, Japanese Patent Application No. 2003-529535 mailed Dec. 7, 2010.

L.P. Hunter, Physics of Semiconductor Material Devices and Circuits, Semiconductor Devices p. 1-10, (1970).

Related Preliminary Korean Office Action, Korean Application No. 10-2004-7001033, dated Nov. 28, 2008.

The Second Office Action from People's Republic of China, re: China Application No. 200480027969.2, Date: Jul. 4, 2008.

International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
Extended Search Report from the European Patent Office re related European Patent Application No. 08160129.6, dated Dec. 15, 2008.
Asbeck P M. et al "Enhancement of Base Conductivity Via the Piezoelectric Effect in AlGaN/BaN HBTs", Solid State Electronics, Elsevier Science Publishers, Barking GB, vol. 44, No. 2, Feb. 2000, pp. 211-219, p. 213, left-hand column.
Johnson M A L et al. "New UV Light Emitter Based on AlGaN Heterostructures with Graded Electron and Hole Injectors", Materials Research Society Symposium—Proceedings 2002 Materials Research Society US, vol. 743, 2002, pp. 481-486, abstract; figure 2.
Simon J et al, "Polarization-induced 3-dimensional Electron Slabs in Graded AlGaN Layeras", Materials Research Society Symposium Proceedings 2006 Materials Research Society US, vol. 892, Nov. 28, 2005, pp. 417-422, abstract, 1 and 4.
Notice Requesting Submission of Opinion re related Korean application No. 10-2004-7001033, dated: Mar. 9, 2009.
Zhang at al. "Comparison of GaN P-I-N and Schottky Rectifier Performance", IEEE Transactions on Electron Devices, vol. 48, No. 3, Mar. 2001, pp. 407-411.
Sakai at al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222. Feb. 24, 2009.
European Search Report re related EP Appl. 08160129.6.2222, Dated: Dec. 15, 2008.
Copending U.S. Appl. No. 11/443,741, filed Jun. 14, 2007.
Copending U.S. Appl. No. 11/685,761, filed Mar. 13, 2007.
Copending U.S. Appl. No. 11/939,059, filed Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
Notice of First Office Action from China Patent Application No. 200710142217.6 dated: Jun. 22, 2009.
Official Communication from the EPO regarding European Application No. 08253301.9, dated Nov. 17, 2009.
Second Office action from related Chinese Application No. 200710142217.6, dated: Nov. 6, 2009.
European Search Report from related European Application No. 07254498.4.
U.S. Appl. No. 11/613,691, filed Dec. 20, 2006.
U.S. Appl. No. 11/614,180, filed Dec. 21. 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Office Action from U.S. Appl. No. 11/600,617, dated: Dec. 22, 2009.
Response to Office Action U.S. Appl. No. 11/600,617, Dated: Mar. 18, 2010.
Office Action from U.S. Appl. No. 11/655,696, dated: Nov. 17, 2008.
Response to Office Action U.S. Appl. No. 11/655,696, dated: Jan. 16, 2009.
Office Action from U.S. Appl. No. 11/655,696, dated: Apr. 6, 2009.
Response to Office Action U.S. Appl. No. 11/655,696, dated: Jun. 8, 2009.
Office Action from U.S. Appl. No. 11/655,696, dated: Jul. 6, 2009.
Response to Office Action U.S. Appl. No. 11/655,696, dated: Jan. 6, 2010.
Notice of Allowance for U.S. Appl. No. 11/655,696 mailed Apr. 2, 2010.
Request for Continued Examination Filed Jun. 18, 2010 U.S. Appl. No. 11/655,696.
Notice of Allowance for U.S. Appl. No. 11/655,696, mailed Jul. 19, 2010.
Notice of Reasons for Rejection for Japanese Patent Application No. JP 2007-143451 dated May 10, 2011.
Extended Search Report for European Patent Application No. 11154411.0 dated May 30, 2011.
Singh Madhusudan, et al., "Examination of Tunnel Junctions in the AlGaN/GaN System: Consequences of Polarization Charge", Applied Physics Letters, AIP, American Institute of Physics, Melville, NY, vol. 77, No. 12, Sep. 18, 2000, pp. 1867-1969.
Panda A.K. et al., "DC and High-Frequency Characteristics of GaN Based Impatts", IEEE Transactions on Electron Devices, IEEE Service Center, Pisacataway, NJ, US vol. 48, No. 4, Apr. 1, 2001, pp. 820-823.
Summary of Notice of Reasons for Rejection for Japanese Patent Application No. 2008-264568 mailed Nov. 15, 2011.
Summary of Notice of Reasons for Rejection for Japanese Patent Application No. 2008-182592 mailed Nov. 22, 2011.
M.A.L. Johnson, et al., New UV Light Emitter Based on AlGaN Heterostructures with Graded Electron and Hole Injectors, Mat. Res. Soc. Symp. Proc. vol. 743, 2003, pp. 481-486.
Simon, John, et al., Polarization-Induced 3-Dimension Electron Slabs in Graded AlGaN Layers, Material Res. Soc. Symp. vol. 892, 2006, pp. 417-422.
Summary of Notice of Reasons for Rejection for counterpart Japanese Patent Application No. JP 2007-292302 mailed Jan. 24, 2012.
Examination Report for counterpart European Patent Application No. 07254498.4 dated Jan. 26, 2012.
Summary of Decision of Rejection from Japanese Patent Application No. 2008-262602, dated May 8, 2012.
Examination of European Patent Application No. 08 253 301.9-2222, dated Apr. 24, 2012.
Decision for Grant for Japanese Patent Application No. 2008-182592, dated Jul. 3. 2012.

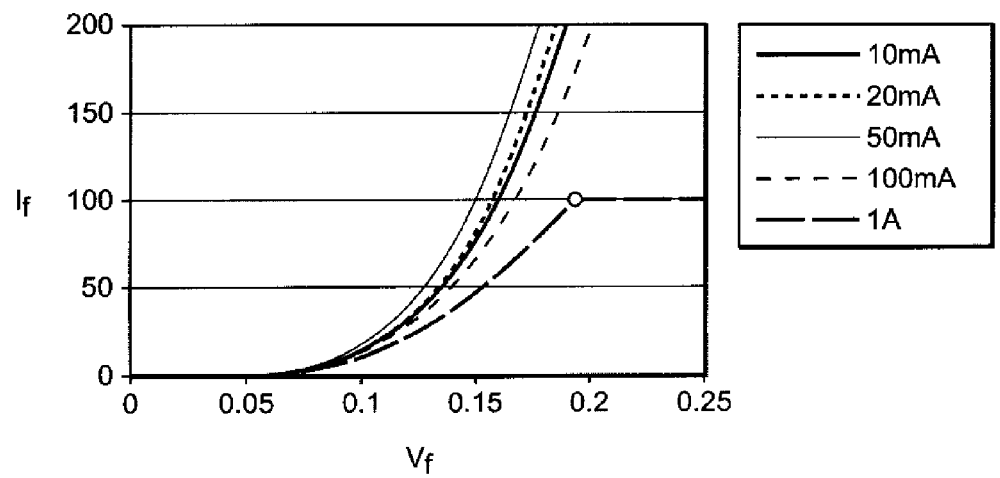
FIG. 11
FIG. 12
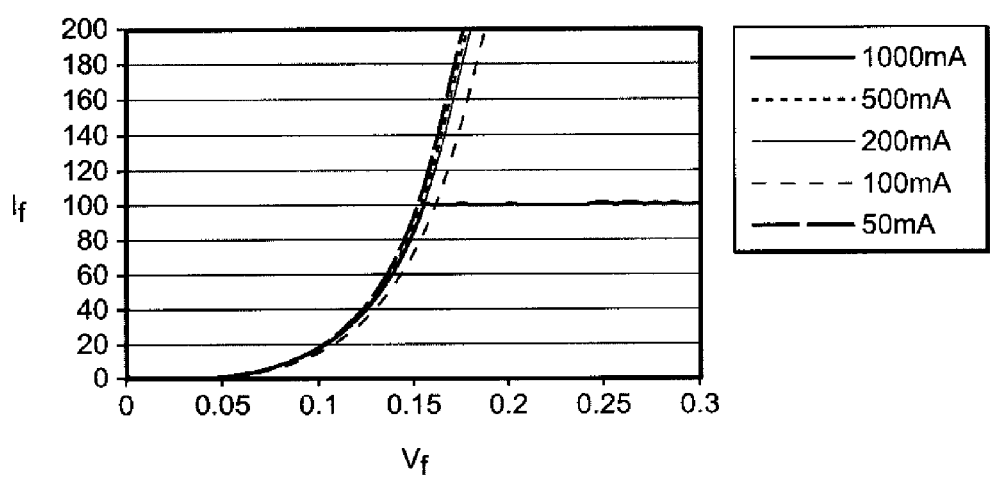

LOW VOLTAGE DIODE WITH REDUCED PARASITIC RESISTANCE AND METHOD FOR FABRICATING

This application is a divisional from, and claims the benefit of, U.S. patent application Ser. No. 11/655,696, filed Jan. 19, 2007, now U.S. Pat. No. 7,834,367 to Parikh et al., having the same title as the present application.

GOVERNMENT RIGHTS

This invention was made with Government support under DARPA Contract No. 4400129974 (as subcontractor—Raytheon as prime). The Government has certain rights in this invention

BACKGROUND OF THE INVENTION

This invention is concerned with diodes, and more particularly diodes exhibiting low on-state forward voltage and reduced parasitic resistance.

A diode is an electronic component that restricts the direction of movement of charge carriers. The diode essentially allows an electric current to flow in one direction, but substantially blocks current flow in the opposite direction.

Diode rectifiers are one of the most widely used devices in low voltage switching, power supplies, power converters and related applications. For efficient operation, it is desirable for such diodes to operate with low on-state voltage (a forward voltage drop $V_f$ of 0.1-0.4V or lower), low reverse leakage current, a voltage blocking capability of 20-30V, and high switching speed. These features are important to achieve high conversion efficiency, which is the final goal of any rectifier for low voltage applications.

The most common diodes are based on semiconductor pn-junctions, typically using silicon (Si), with impurity elements introduced to modify, in a controlled manner, the diode's operating characteristics. Diodes can also be formed from other semiconductor materials, such as gallium arsenide (GaAs) and silicon carbide (SiC). In a pn diode, conventional current can flow from the p-type side (the anode) to the n-type side (the cathode), but not in the opposite direction.

A semiconductor diode's current-voltage, or I-V, characteristic curve is attributable to the depletion layer or depletion zone that exists at the pn junction between the differing semiconductor layers. When a pn junction is first created, conduction band (mobile) electrons from the n-doped region diffuse into the p-doped region, where there is a large population of holes (locations for electrons where no electron is present) with which the electrons can "recombine". When a mobile electron recombines with a hole, the hole vanishes and the electron is no longer mobile, i.e., two charge carriers are eliminated. The region around the p-n junction becomes depleted of charge carriers and thus behaves as an insulator.

The width of the depletion zone, however, cannot grow without limit. For each electron-hole pair that recombines, a positively charged dopant ion is left behind in the n-doped region and a negatively charged dopant ion is left behind in the p-doped region. As recombination proceeds and more ions are created, an increasing electric field develops through the depletion zone, which acts to slow and then eventually stop recombination. At this point, there is a 'built-in' potential across the depletion zone.

If an external voltage is placed across the diode with the same polarity as the built-in potential, the depletion zone continues to act as an insulator, preventing any significant electric current. This is the reverse bias phenomenon. If the polarity of the external voltage opposes the built-in potential, however, recombination can once again proceed, resulting in substantial electric current through the p-n junction. For silicon diodes, the built-in potential is approximately 0.6 V. Thus, if an external current is passed through the diode, about 0.6 V will be developed across the diode, causing the p-doped region to be positive with respect to the n-doped region. The diode is said to be 'turned on', as it has a forward bias.

A diode's I-V characteristic can be approximated by two regions of operation. Below a certain difference is potential between the two leads attached to the diode, the depletion layer has significant width, and the diode can be thought of as an open (non-conductive) circuit. As the potential difference is increased, at some point the diode will become conductive and allow charges to flow. The diode can then be considered as a circuit element with zero (or at least very low) resistance. In a normal silicon diode at rated currents, the voltage drop across a conducting diode is approximately 0.6 to 0.7 volts.

In the reverse bias region for a normal p-n rectifier diode, the current through the device is very low (in the μA range) for all reverse voltages up to a point called the peak inverse voltage (PIV). Beyond this point, a process called reverse breakdown occurs, which causes the device to be damaged, accompanied by a large increase in current.

One disadvantage of a junction diode is that, during forward conduction, the power loss in the diode can become excessive for large current flow. Another type of diode, the Schottky barrier diode, utilizes a rectifying metal-to-semiconductor barrier instead of a pn junction. The junction between the metal and the semiconductor establishes a barrier region that, when properly fabricated, will minimize charge storage effects and improve the switching performance of the diode by shortening its turn-off time. [L. P. Hunter, Physics of Semiconductor Materials, Devices, and Circuits, Semiconductor Devices, Page 1-10 (1970)].

Common Schottky diodes have a lower forward voltage drop than pn-junction diodes and are thus more desirable in applications where energy losses in the diode can have a significant negative impact on the performance of the system, e.g., where diodes are used as output rectifiers in a switching power supply. For such applications, it is highly desirable to provide a rectifier with a very low forward voltage drop (0.1-0.4V), reduced reverse leakage current, low voltage blocking capability (20-30V), and high switching speed. These features are important to achieve high conversion efficiency, which is the final goal of any rectifier that is to be used for low voltage applications.

Schottky diodes can be used as low loss rectifiers, although their reverse leakage current is generally much higher than other rectifier designs. Schottky diodes are majority carrier devices; as such, they do not suffer from minority carrier storage problems that slow down most normal diodes. They also tend to have much lower junction capacitance than pn diodes, which contributes to their high switching speed.

One way to reduce the on-state voltage below 0.5V in a conventional Schottky diode is to reduce the diode's surface barrier potential. Reducing the barrier potential, however, results in a tradeoff of increased reverse leakage current. In addition, the reduced barrier can degrade high temperature operation and result in soft breakdown characteristics under reverse bias operation.

In addition, for Schottky diodes that are made of GaAs; one disadvantage of this material is that the Fermi level (or surface potential) is fixed or pinned at approximately 0.7 volts. (Si Schottky diodes also have this limitation to a certain extent.) As a result, the on-state forward voltage ($V_f$) is fixed. Regardless of the type of metal used to contact the semiconductor, the surface potential in such a diode cannot be lowered to lower $V_f$.

One solution to this limitation with GaAs is the gallium nitride (GaN) material system. GaN has a 3.4 eV wide direct bandgap, high electron velocity ($2\times10^7$ cm/s), high breakdown fields ($2\times10^6$ V/cm) and the availability of heterostructures. GaN based low voltage diodes can achieve reduced forward voltage drops in comparison with conventional Schottky diode rectifiers (See, e.g., Parikh, et al., Gallium Nitride Based Diodes with Low Forward voltage and Low Reverse Current Operation, U.S. patent application Ser. No. 10/445,130, filed May 20, 2003, which is commonly assigned and the specification of which is incorporated herein by reference as if described in its entirety).

GaN low voltage diodes, however, can be typically fabricated on a SiC or GaN substrate. For a vertical diode device, the substrate is in the conductive path and contributes to the voltage drops. With typical substrate resistivity values of around 20-30 mohm-cm for SiC/GaN substrates, a 200 μm thick substrate will add 40-60 mV of voltage drop at an operating current density of 100 A/cm². This additional voltage drop is unacceptable, since the target for total voltage drop at operating current is <200 mV. Furthermore, for the most commonly used SiC substrate (GaN substrates are expensive and small in diameter), an additional barrier is encountered at the GaN epi-SiC substrate interface. While there are techniques used to mitigate this barrier, they add extra complexity and may also contribute to increased resistance.

Consequently, a need has developed in the art for diodes that can be operated with lower forward voltage drops.

BRIEF SUMMARY OF THE INVENTION

This invention provides a semiconductor diode structure and method for fabrication a diode structure that substantially reduces parasitic resistance in the diode and eliminates the associated resistive voltage drops.

A method of making a diode involves depositing an n+ semiconducting buffer layer on a substrate, depositing an n− semiconducting layer on the n+ layer, depositing a semiconducting barrier layer on the n− layer, and depositing a dielectric layer on the barrier layer. A portion of the dielectric layer is then removed, and a Schottky metal is deposited on the barrier layer in the void left by the removed portion. The dielectric layer and the Schottky metal are affixed to a conductive support layer with a metal bonding layer, the substrate is removed to expose the n+ layer, portions of the n+, n−, and barrier layers are selectively removed to form a mesa diode structure on the dielectric layer over the Schottky metal; and an ohmic contact is deposited on the n+ layer.

A second method of making a diode, is similar to the first, except that, after depositing a Schottky metal on the barrier layer, selective portions of the n+ and n− layers are removed to form a mesa diode structure under the Schottky metal, the substrate is removed under the mesa diode structure to form a via, and an ohmic contact is deposited on the n+ layer in the via.

A third method of making a diode is similar to the second method, except that the substrate is a GaN substrate and that, after selective portions of the n+ and n− layers are removed to form a mesa diode structure, the GaN substrate is thinned to reduce parasitic substrate resistance and the ohmic contact is deposited on the thinned substrate.

In more particular embodiments, the n+ layer, the n− layer, and the barrier layer comprise Group III nitrides. A nucleation layer may be deposited on the substrate, prior to depositing the n+ layer on the substrate. The nucleation layer may be $Al_xGa_{1-x}N$, and the n+ layer may be n+ doped GaN, particularly, a layer of GaN between 0.5 and 5 μm thick and doped with an impurity concentration of between $5\times10^{17}/cm^3$ and $5\times10^{19}/cm^3$.

The n− layer may be n− doped GaN, particularly, a layer of GaN between 0.5 and 5 μm thick and doped with an impurity concentration of between $1\times10^{15}/cm^3$ and $1\times10^{17}/cm^3$. The barrier layer may be AlGaN, particularly a layer with 30% Al for the $Al_xGa_{1-x}N$ with $15 \leq x \leq 45$. The thickness of the barrier layer may be between 0-30 A, particularly 5 A. The dielectric layer may be a $SiO_2$ dielectric layer. The Schottky metal may be selected from the group consisting of Cr, Ge, Fe, Mn, Nb, Ni, NiCr, Sn, Ta, Ti, and W, preferably Cr.

The conductive support layer may be metallized Si, while the dielectric layer may be affixed to the support layer with a metal bonding layer using an Au—Sn Eutectic wafer bonding process. The ohmic contact material may be selected from the group consisting of Al/Au and Ti/Au or other suitable ohmic contacts to n+ GaN. Removing the substrate to expose the n+ layer may be accomplished using reactive ion etching. After affixing the dielectric layer to the support layer with a metal bonding layer, a backside bonding layer may be affixed to the support layer opposite the dielectric layer.

BRIEF DESCRIPTION OF THE DRAWINGS

FIGS. 11 and 12 are graphs depicting the performance measured for diodes constructed according to the invention.

DETAILED DESCRIPTION OF THE INVENTION

This invention provides rectifier diodes with very low forward voltage ($V_f$) values, for use in applications such as high efficiency power supplies, as well as other applications such as low voltage switching power supplies and power converters.

In one embodiment of a method according to the present invention provides full-wafer bonding of gallium nitride devices on a SiC substrate with front-side processing completed, to a metalized wafer carrier wafer. The SiC substrate is removed and ohmic contacts are places directly on the n+ GaN epitaxial layer. This eliminates the GaN—SiC interface barrier/resistance path as well as the SiC substrate resistance path. This helps minimize or reduce the parasitic resistive voltage drops.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1:
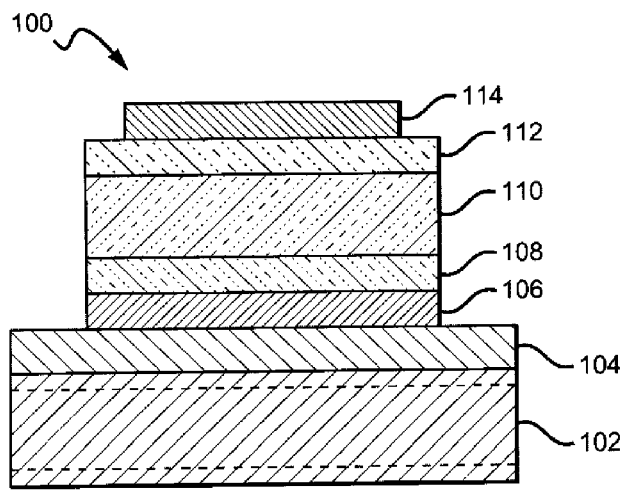
FIG. 1 is a sectional view of one embodiment of a diode constructed according to the invention.

FIG. 1 shows one embodiment of a Schottky diode 100 constructed in accordance with the present invention that can be fabricated from many different material systems. The diode 100 is shown as a single device for ease of description and understanding, but as further described below, the diodes 100 are typically fabricated at a wafer level and then singulated from the wafer into individual devices. Thousands of devices are typically fabricated from a single wafer level process.

The preferred diode 100 is fabricated using the Group-III nitride based material system. Group-III nitrides include the semiconductor compounds formed between nitrogen and the elements in Group-III of the periodic table, usually aluminum (Al), gallium (Ga), and indium (In). This group also includes ternary and tertiary compounds such as AlGaN and AlInGaN. The preferred materials for the diode are GaN and AlGaN.

The diode 100 includes a substrate 102 of conductive material, that can be made of different materials but is preferable metallized silicon (Si) that acts as a conductive support layer for the device. A metal bonding layer 104 connects the support layer 102 to a Schottky metal layer 106. A semiconducting AlGaN barrier layer 108 is disposed on the Schottky layer opposite the bonding layer, with an n− semiconducting GaN layer 110 disposed on the barrier layer. An n+ semiconducting GaN buffer layer 112 is disposed on the n− layer. Finally, an ohmic contact 114, which provides an electrical connection to the diode through the layer 112, is disposed on the layer 112.

One method of making the diode depicted in FIG. 1 is shown in FIGS. 2-10, and the method is described herein with reference to a single device with the understanding that the method is equally applicable to fabricated devices at the wafer level. The method is described with reference to certain materials having particular compositions, but it is understood that different materials can used having different compositions.

Figure 2:
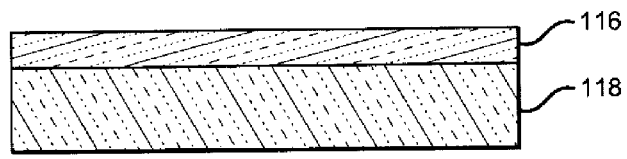
FIGS. 2, 3, 4, 5, 6, 7, 8, 9, and 10 are sectional views illustrating the steps in a process of fabricating a diode according to the invention.

The method begins, as depicted in FIG. 2, with the deposition of an $Al_xGa_{1-x}N$ nucleation layer 116 on a substrate 118, with the AlN composition (i.e., x=1) being preferred for the nucleation layer 116. A variety of materials for the substrate 118, such as silicon, sapphire and silicon carbide, can be used for the substrate. The substrate 118 is preferably silicon carbide (SiC), however, which has a much closer crystal lattice match to Group III nitrides than sapphire and results in Group III nitride films of higher quality. SiC substrates are available from Cree Research, Inc., of Durham, N.C. and methods for producing them are set forth in the scientific literature, as well as in, e.g., U.S. Pat. Nos. Re. 34,861; 4,946,547; and 5,200,022.

Figure 3:
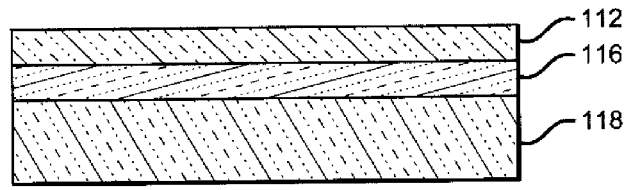

Next, as shown in FIG. 3, an n+ semiconducting buffer layer 112 is deposited on the nucleation layer 116. The buffer layer is preferably GaN between 0.5 and 5 μm thick, doped with an impurity concentration of between $5\times10^{17}/cm^3$ and $5\times10^{19}/cm^3$.

Figure 4:
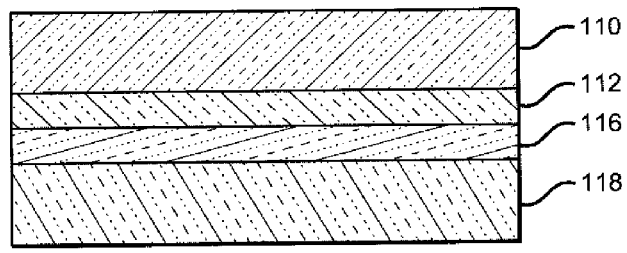

In FIG. 4, an n− semiconducting layer 110 is then deposited on the buffer layer 112, with the layer 110 preferably being formed of GaN between 0.5 and 5 μm thick, doped with an impurity concentration of between $1\times10^{15}/cm^3$ and $1\times10^{17}/cm^3$.

Figure 5:
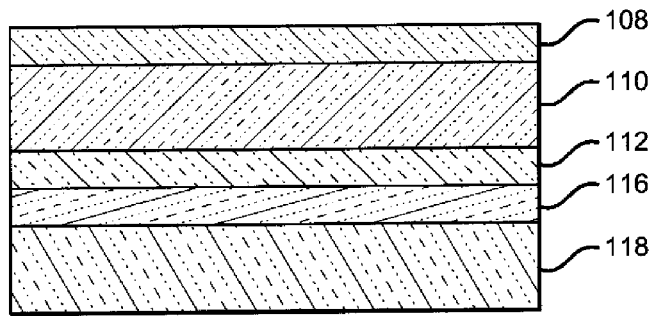

A semiconducting barrier layer 108 of $Al_xGa_{1-x}N$, as shown in FIG. 5, is deposited on the n− layer 110. The barrier layer 108 is preferably 5 Å thick and with a composition within the range of $15 \leq x \leq 45$. The n+, n− and barrier layers may be deposited by deposition techniques known in the semiconductor fabrication art, including, e.g., metal-organic chemical vapor deposition (MOCVD).

Figure 6:
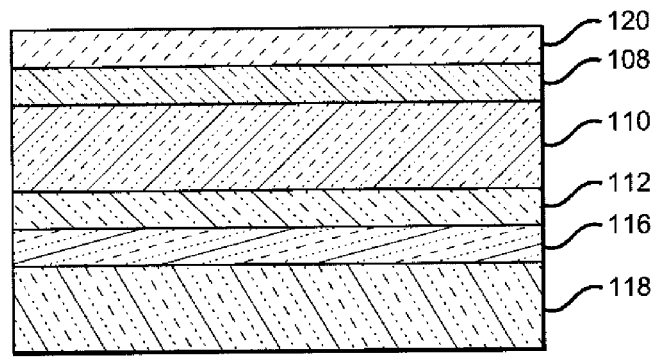
Figure 7:
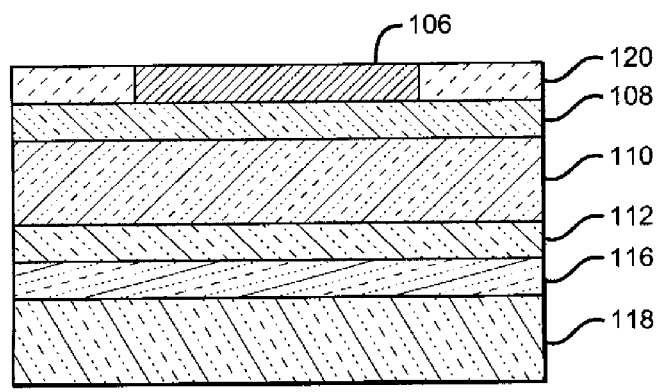

Next, as depicted in FIG. 6, an $SiO_2$ dielectric layer 120 is deposited on the barrier layer 108, then, as shown in FIG. 7, a portion of the dielectric layer is removed and a Schottky metal 106 is deposited in the void remaining after the portion has been removed, so that the Schottky metal is in electrical contact with the barrier layer 108. Standard metallization techniques, as known in the art of semiconductor fabrication, can be used to form the Schottky metal, which is preferably Cr, although other metals could be used to achieve a low barrier height, the preferred materials being Cr, Fe, Mn, Nb, Ni, NiCr, Sn, Ta, Ti, Ge, and W. Schottky metals with different work functions result in different barrier potentials. Cr provides an acceptable barrier potential for a diode with Vf of around 0.2 v and is easy to deposit by conventional methods.

The metal should be chosen to provide a low Schottky barrier potential and low $V_f$, but high enough so that the reverse current remains low. If the metal chosen, for example, had a work function equal to the semiconductor's electron affinity, the barrier potential would approach zero (except in the case of a tunnel diode), resulting in a $V_f$ that approaches zero and also increases the diode's reverse current, such that the diode would become ohmic in nature and provide no rectification.

The dielectric layer 120 is used as a protective layer and can be removed selectively at various points in the process. Alternatively, the Schottky metal could be deposited in a complete layer, then etched off later to define the Schottky barrier contact.

Figure 8:
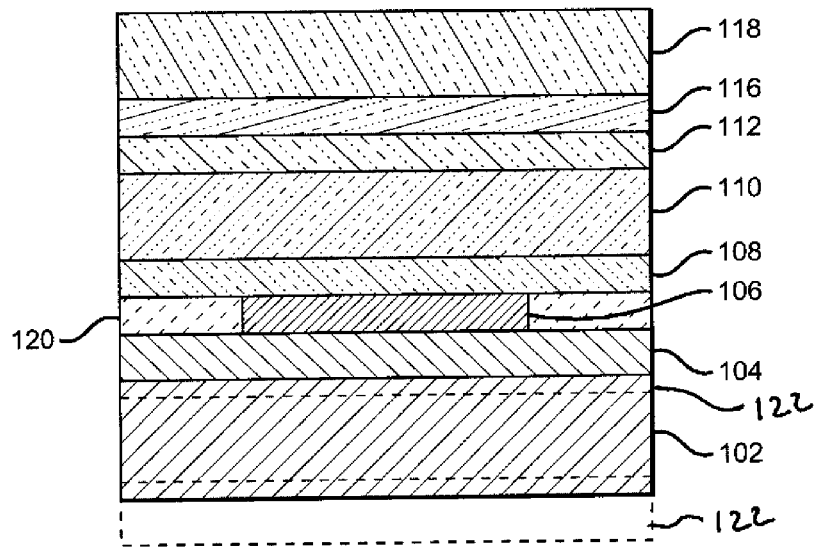

At this point, as shown in FIG. 8, the structure is flipped over and the dielectric layer/Schottky metal is bonded to a metallized Si conductive support layer 102 by means of a metal bonding layer 104, preferably utilizing an Au—Sn utectic wafer bonding process. The bonding layer is thick metal, which exhibits a higher coefficient of thermal expansion than Si. Consequently, when a bonded wafer cools after the bonding process, this difference in thermal expansion may cause tensile stress in the bonding layer. When the substrate 118 is later removed, as described below, the tensile stress in the bonding layer may cause the support layer 102 and the remaining layers to bow. This distortion in the layers is undesirable for subsequent fabrication steps, particularly those involving photolithography.

The tensile stress effect can be ameliorated by adding an optional backside bonding layer 122 to the backside of the layer 104 (the backside bonding layer should be contacted by a nonmetallic surface during the bond process, to ensure that it adheres only to the support layer 102, and not to the bond tool). With the additional bond layer, tensile stress is introduced in both bonding layers upon cool down. The stress in the backside bonding layer counteracts the stress introduced by the bond layer 102 to minimize the bowing after the removal of the substrate 118.

Figure 9:
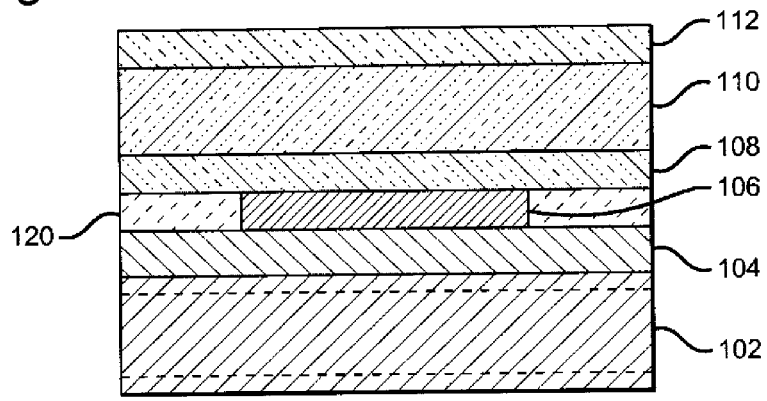

Next, as depicted in FIG. 9, the SiC substrate 118 and the nucleating layer 116 are thinned and removed, and different removal methods can be used according to the present invention. In one embodiment most of the SiC substrate is removed by grinding, leaving only a remaining thin layer (e.g. 10-30 micron) that can be removed by reactive ion etching or other dry etching like Inductively Coupled Plasma Etching (ICP).

Figure 10:
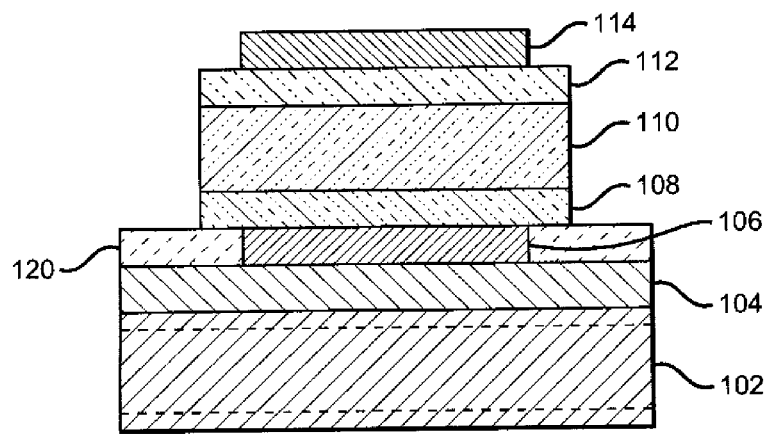

As shown in FIG. 10, selected portions of the n+, n−, and barrier layers are then removed to form a mesa diode structure on the $SiO_2$ dielectric layer 120 over the Schottky metal 106. The removal can be accomplished by a number of etching techniques known in the semiconductor fabrication art, including, e.g., chemical etching, reactive ion etching (RIE), and ion mill etching. Finally, an ohmic contact 114 is deposited on the n+ layer 112 to complete the diode.

Low voltage diodes were fabricated by the method above, with a 2 μm thick n+ layer doped to $1\times10^{16}/cm^3$, a 1 μm thick n− layer doped to $1\times10^{16}/cm^3$, and a thin 5 Å barrier layer of approximate composition $Al_{0.3}Ga_{0.7}N$. An Al/Au ohmic contact was used. Standard dicing techniques were performed to obtain individual devices.

FIG. 11, which is a plot of forward current $I_f (A/cm^2)$ on the vertical axis versus forward voltage $V_f (V)$ on the horizontal axis, as well as Table 1 below, display the performance exhibited by these devices.

TABLE 1

| $I_f(A/cm^2)$ | $V_f(V)$ | $V_r (I_f/I_r = 100)$ |
|---|---|---|
| 100 | 0.15 | −3.31 |
| 200 | 0.18 | −7.77 |

This diode structure exhibits minimal parasitic resistance. Besides yielding a low $V_f$, these diode may be operable at a current density of greater than 100 A/cm², hence improving capacitance per unit amperage. At the 1 A level, these devices began to show the impact of current spreading, because the total metal thickness for the ohmic contact was less than 0.5 μm. Metal thickening, to increase the ohmic metal to greater than 2 μm, should ameliorate this issue. Because of the low intrinsic barrier for these devices, they could be operated at a high forward current of 200 A/cm², thereby gaining a capacitance advantage.

These devices were then packaged using standard Ag—Sn based die attachment techniques. The results for the packaged diodes are shown in FIG. 12 that, like FIG. 11, is a plot of forward current $(I_f)$ on the vertical axis versus forward voltage $(V_f)$ on the horizontal axis.

Figure 13:
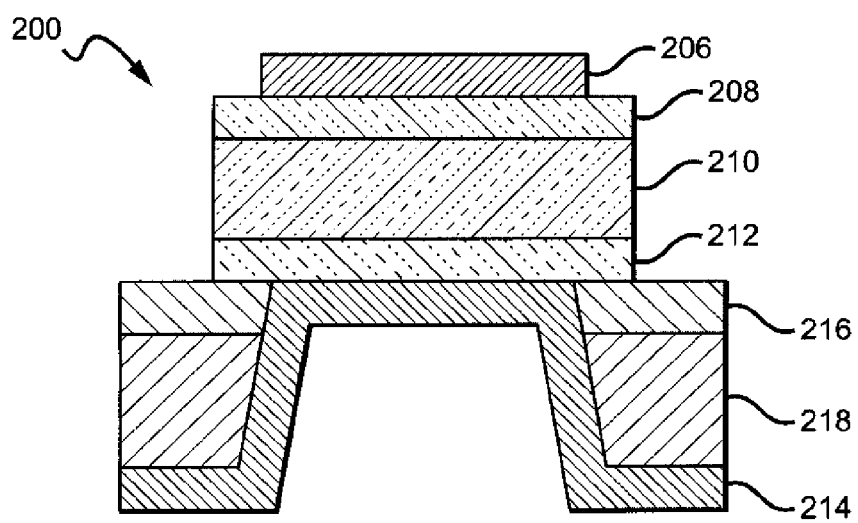
FIGS. 13 and 14 are sectional views, analogous to FIG. 1, depicting alternative embodiments of diodes constructed according to the invention.

The diode of the invention can also be made in alternative embodiments. Instead of complete removal of the substrate, for example, a via can be etched in the substrate to remove the material under the active device and to retain the remainder of the substrate material for mechanical support. A diode 200, made according to this second embodiment, is depicted in FIG. 13, which is similar to FIG. 1. The diode 200 is fabricated in a manner similar to the process described in conjunction with FIGS. 2 through 7. A nucleation layer 216 is deposited on a SiC substrate 218, then an n+ semiconducting buffer layer 212 is deposited on the nucleation layer. An n− semiconducting layer 210 is deposited on the buffer layer 212 and a semiconducting barrier layer 208 is deposited on the n− layer 210. A Schottky metal layer 206 is deposited on the barrier layer 208.

Selected portions of the n+, n−, and buffer layers are then removed to form a mesa diode structure under the Schottky metal. Finally, a portion of the substrate 218 and the nucleation layer 216 is removed under the mesa diode structure to form a via, then an ohmic contact layer 214 is deposited on the substrate and in the via, such that the ohmic contact layer electrically connects with the n+ layer 212.

A third embodiment of the diode can be implemented on a bulk GaN wafer, with the bulk GaN wafer being subsequently thinned to reduce parasitic substrate resistance. The bulk GaN wafer does not need to be completely removed since there is no heterostructure epi-substrate interface, as with the GaN diode fabricated on a SiC substrate. Other than the elimination of this interfacial voltage drop, reduction of substrate parasitic will be a function of the extent of thinning of the GaN substrate wafer.

Figure 14:
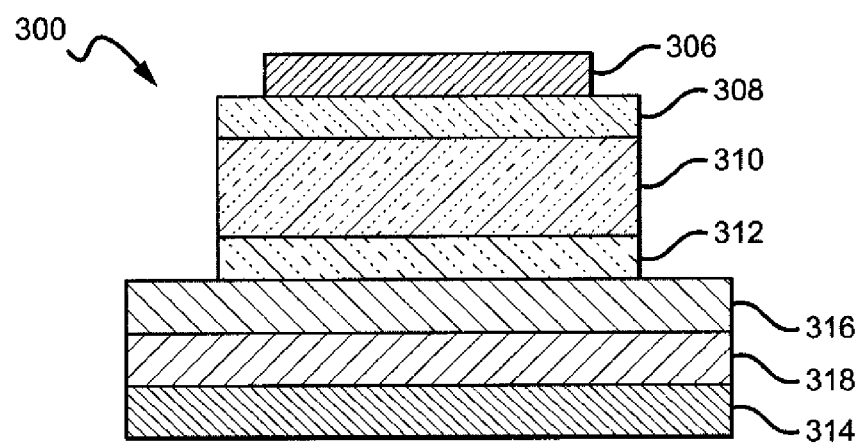

The third embodiment is shown as the diode 300, as depicted in FIG. 14, which is also similar to FIG. 1. This embodiment, like the second embodiment, is fabricated using a process similar to that described in conjunction with FIGS. 2 through 7. A nucleation layer 316 is deposited on a GaN substrate 318, then an n+ semiconducting buffer layer 312 is deposited on the nucleation layer. An n− semiconducting layer 310 is deposited on the buffer layer 312 and a semiconducting barrier layer 308 is deposited on the n− layer 310. A Schottky metal layer 306 is deposited on the barrier layer 308.

Selected portions of the n+, n−, and buffer layers are then removed to form a mesa diode structure under the Schottky metal. The GaN substrate 318 is thinned sufficiently to reduce parasitic resistance associated with the substrate, then an ohmic contact layer 314 is deposited on the substrate.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The invention claimed is:

1. A diode, comprising:
   a conductive support layer;
   a Schottky metal layer on the conductive support layer;
   a semiconducting barrier layer on the Schottky layer opposite the conductive support layer;
   an n− semiconducting layer on the barrier layer opposite the Schottky layer;
   an n+ semiconducting buffer layer on the n− layer opposite the barrier layer; and
   an ohmic contact on the n+ layer opposite the n− layer.

2. The diode of claim 1, further comprising a metal bonding layer affixing the Schottky layer to the support layer.

3. The diode of claim 1, wherein the n+ layer, the n− layer, and the barrier layer comprises Group III nitrides.

4. The diode of claim 1, wherein the Schottky metal is selected from the group consisting of Cr, Fe, Mn, Nb, Ni, NiCr, Sn, Ta, Ti, Ge, and W.

5. The diode of claim 2, wherein the conductive support layer is metallized Si.

6. A diode, comprising:
   a conductive support layer;
   a Schottky metal layer;
   a metal bonding layer affixing the Schottky layer to the support layer;
   a 0-20 Å thick semiconducting barrier layer of $Al_xGa_{1-x}N$, with $0.15 \leq x \leq 0.45$, disposed on the Schottky layer opposite the bonding layer;

an n− semiconducting layer of GaN, between 0.5 and 5 μm thick and doped with an impurity concentration of between $1\times10^{15}/cm^3$ and $1\times10^{17}/cm^3$, disposed on the barrier layer opposite the Schottky layer;

an n+ semiconducting buffer layer of GaN, between 0.5 and 5 μm thick and doped with an impurity concentration of between $5\times10^{17}/cm^3$ and $5\times10^{19}/cm^3$, disposed on the n− layer opposite the barrier layer; and an ohmic contact disposed on the n+ layer opposite the n− layer.

7. The diode of claim 1, exhibiting a $V_f$ of approximately 0.2V.

8. The diode of claim 1, exhibiting a $V_f$ of less than 0.2V.

9. The diode of claim 1, wherein said n+ semiconducting buffer layer of GaN is between 0.5 and 5 μm thick and doped with an impurity concentration of between $5\times10^{17}/cm^3$ and $5\times10^{19}/cm^3$.

10. The diode of claim 1, wherein said n− semiconducting layer of GaN, is between 0.5 and 5 μm thick and doped with an impurity concentration of between $1\times10^{15}/cm^3$ and $1\times10^{17}/cm^3$.

11. The diode of claim 1, wherein said semiconducting barrier layer comprises $Al_xGa_{1-x}N$ and is between 0-20 Å thick, with $0.15 \leq x \leq 0.45$.

12. The diode of claim 6, wherein the Schottky metal comprises a material from the group consisting of Cr, Fe, Mn, Nb, Ni, NiCr, Sn, Ta, Ti, Ge, W and combinations thereof.

13. The diode of claim 6, wherein the conductive support layer comprises a metallized layer.

14. The diode of claim 6, wherein the conductive support layer is metallized Si.

15. The diode of claim 6, exhibiting a $V_f$ of approximately 0.2V.

16. The diode of claim 6, exhibiting a $V_f$ of less than 0.2V.

17. The diode of claim 1, further comprising a bonding layer between the conductive support layer and the Schottky metal layer.

* * * * *